United States Patent [19]

Matsumoto

[11] Patent Number: 4,812,028
[45] Date of Patent: Mar. 14, 1989

[54] REFLECTION TYPE REDUCTION PROJECTION OPTICAL SYSTEM

[75] Inventor: Kohichi Matsumoto, Kita, Japan
[73] Assignee: Nikon Corporation, Tokyo, Japan
[21] Appl. No.: 171,169
[22] Filed: Mar. 21, 1988

Related U.S. Application Data

[63] Continuation of Ser. No. 755,356, Jul. 16, 1985, abandoned.

[30] Foreign Application Priority Data

Jul. 23, 1984 [JP] Japan ................................ 59-152502
Mar. 6, 1985 [JP] Japan ................................ 60-44123

[51] Int. Cl.$^4$ ............................................. G02B 17/08
[52] U.S. Cl. .................................... 350/444; 350/442; 350/505
[58] Field of Search ................ 350/442, 443, 444, 505

[56] References Cited

U.S. PATENT DOCUMENTS

| | | | |
|---|---|---|---|
| 3,748,015 | 7/1973 | Offner | 350/55 |
| 4,293,186 | 10/1981 | Offner | 350/444 X |
| 4,331,390 | 5/1982 | Shafer | 350/444 |
| 4,469,414 | 9/1984 | Shafer | 350/414 |

OTHER PUBLICATIONS

J. Dyson, "Unit Magnification Optical System Without Seidel Aberrations", Jul. 1959, pp. 713–716, Journal of Optical Society of America, vol. 49, No. 7.
C. G. Wynne, "A Unit-Power Telescope for Projection Copying", 1970, pp. 429–434, Optical Instruments and Techniques, Oriel Press Limited.
A. P. Grammatin, "Some Properties of Concentric Optical Systems", Apr. 1971, pp. 210–211, Optical Technology, vol. 38, No. 4.

Primary Examiner—John K. Corbin
Assistant Examiner—Scott J. Sugarman
Attorney, Agent, or Firm—Shapiro and Shapiro

[57] ABSTRACT

A reflection type projection optical system suitable for projection of a micropattern object is capable of performing reduction projection. The projection optical system comprises first and second optical subsystems which are combined to set a Petzval sum to zero. A first optical subsystem S1 forms a reduced image of an object, and a second optical subsystem S2 forms a further reduced object image from the image formed by the first optical subsystem S1.

15 Claims, 8 Drawing Sheets

REFLECTION TYPE REDUCTION PROJECTION OPTICAL SYSTEM

This is a continuation application of Ser. No. 755,356, filed July 16, 1985, now abandoned.

BACKGROUND OF THE INVENTION

1. Field of the Invention

The present invention relates to a reflection optical system for forming a projection image and, more particularly, to a reflection optical system suitable for projection of a micropattern image such as of semiconductor device pattern.

2. Description of the Prior Art

A conventional reflection optical system of this type projects a mask pattern on a wafer pattern at an equal size. In a reflection type optical system disclosed in U.S. Pat. No. 3,748,015, a high-quality image is formed in an arcuate field of view by using concave and convex reflection surfaces, as in an optical system of Offner. Another reflection optical system using one concave reflection surface and one refracting member is proposed by J. Dyson, as per "Unit Magnification Optical System without Seidel aberrations", Journal of Optical Society of America, Vol. 49. P. 713, 1959.

In an Offner optical system, high performance is achieved by inserting a meniscus lens member, as exemplified in U.S. Pat. No. 4,331,390. In a Dyson optical system, various improvements including use of an achromatic lens are proposed by C. G. Wynne, "A Unit-Power Telescope for Projection Copying" in "Optical Instruments and Techniques" published by Oriel Press Limited and edited by J. H. Dickson, 1970.

However, these conventional systems are based on a unit magnification factor. When any of these conventional systems is used as an optical system in a projection exposure apparatus for semiconductor device manufacture, the size of the photomask must be the same as that of an integrated circuit, thus resulting in difficulty in the manufacture of photomasks. Another optical system is also proposed to project a reduction image using only a refracting system without a reflecting surface. This optical system comprises ten to 20 glass members. In this case, light absorption by the glass members is increased, resulting in inconvenience. In particular, when an exposure wavelength is shortened and far ultraviolet rays are used to satisfy the needs of further micropatterning of ICs, light absorption by the glass members becomes a critical problem. It is thus to be expected that patterning by the refracting system will be limited.

An advantage of a conventional optical system has been proposed by A. P. Grammatin in "Some Properties of Concentric Optical Systems", Optical Technology Vol. 38, No. 4, P. 210, 1970, wherein optical planes are monocentrically arranged, and an object point and an image point are formed in a plane perpendicular to an optical axis and including the center of the monocentric optical planes. The principle of operation of this optical system will be briefly described.

Since all the optical planes are monocentric, inclined angles of paraxial rays emitted from the monocentric center, i.e., from a point on an optical axis of the object surface, do not change their values except for their signs. A magnification factor is equal to a ratio of a refractive index of the object space to that of the image space. Similarly, the rays emitted from the object point along the optical axis do not change their inclined angles irrespective of the numerical aperture (NA). Therefore, the spherical aberration and the sine condition are strictly zero. When the sine condition is satisfied, coma is corrected in at least a third-order aberration region. Furthermore, when sagittal pencil and meridional pencil image surfaces are considered, the sagittal pencil image surface does not have a curvature of field for the same reason as for zero spherical aberration.

SUMMARY OF THE INVENTION

It is an object of the present invention to resolve the problems of a conventional projection optical system and to provide a reflection type projection optical system capable of performing reduction projection.

According to an aspect of the present invention, the reflection type projection optical system comprises first and second optical subsystems which are combined to set a Petzval sum to zero. A first optical subsystem S1 forms a reduced image of an object, and a second optical subsystem S2 forms a further reduced object image of the image reduced by the first optical subsystem S1.

According to an aspect of the resent invention, the first optical subsystem S1 has a concave first reflecting surface M1, a convex second reflecting surface M2 and a concave third reflecting surface M3 which are monocentrically arranged. The first and third reflecting surfaces M1 and M3 oppose the second reflecting plane M2. An object plane O and an image plane I in the first optical subsystem S1 are located within a plane perpendicular to an optical axis A1 of the subsystem S1 and including a monocentric center C. The first optical subsystem S1 has a first refracting member P1 at an exit side of the third reflecting surface M3. The first refracting member P1 has a refracting incident surface R1 having its center substantially coinciding with the monocentric center C and a refractive exit surface R2 which is located near the image plane I and which is substantially parallel to the image plane I. The second optical subsystem S2 has a concave fourth reflecting surface M4 having as its center the monocentric center C of the first optical subsystem S1 or a point optically equivalent to the center C. The second optical subsystem S2 has as an object surface O' the image plane I of the first optical system. The second optical subsystem S2 has the object plane O' and an image plane I' in a plane which includes the curvature center of the fourth reflecting surface and which is perpendicular to an optical axis A2 of the second optical subsystem. The second optical subsystem S2 also has a refracting member P2 at the exit side of the fourth reflecting surface R4. The refracting member P2 has a refracting incident surface R3 substantially monocentric with the center C of the fourth reflecting surface R4 and a refracting exit surface R4 which is located near the image plane I' and which is substantially parallel thereto. In the monocentric optical system of the present invention, the object plane and the image plane are located in a plane including the monocentric center, so that the optical axis passes through the center and can be defined as a line perpendicular to the plane.

According to another aspect of the present invention, an aplanatic surface is used in addition to the monocentric reflecting surfaces, thereby performing projection at a high reduction factor (or a high magnification factor). In this aspect, there are provided a plurality of reflecting surfaces and a plurality of refracting surfaces which have an identical curvature center along a given optical axis. The plurality of refracting surfaces include an aplanatic refracting surface. Object point positions of the plurality of reflecting surfaces along the optical axis are coincident substantially with the centers thereof. The refracting surfaces excluding the aplanatic refracting surface comprise flat refracting surfaces which have curvature centers coincident with object points thereas along the optical axis or which are coincident with object or image points or conjugate positions therewith of the optical system.

One of the features of the present invention is that a magnification factor of the reflecting surfaces is −1, i.e., that the object point of each reflecting surface along the optical axis is the same as the image point along the optical axis thereof.

Another feature of the present invention is to satisfy one of the following conditions for the refracting surfaces.

First, the object position of the refracting surface along the optical axis is coincident with the curvature center thereof. In other words, a monocentric refracting surface is formed.

Second, if an object point distance of the refracting surface is s, an image point distance thereof is s', a refractive index of a medium located just in front of the refracting surface along the beam propagation direction is N, and a refractive index of a medium located just behind the refracting surface is N', a radius R of curvature of the refracting surface must satisfy the following equation:

$$R = Ns/(N+N') = (N's')/(N+N')$$

In other words, an aplanatic refracting surface must be formed.

Third, the refracting surface must be located at the object or image point or at a conjugate position therewith along the optical axis of the entire optical system, and its radius of curvature is infinite.

As is apparent from Gauss optics, a monocentric reflecting surface has a magnification factor of −1, and a monocentric refracting surface with an infinite radius of curvature has a magnification of +1. If a refractive index of a medium located in front of the monocentric refracting surface is N and a refractive index of a medium located behind the monocentric refracting surface is N', a magnification factor $\beta c$ of this refracting surface is given as follows:

$$\beta c = N/N'$$

When light is incident through air on a monocentric refracting surface of a medium having a refractive index n, a magnification of this furface is 1/n. However, when light exits from this medium to air, a magnification factor of the monocentric refracting surface is n.

A magnification factor $\beta a$ of the aplanatic refracting surface is given as follows:

$$\beta a = (N/N')^2$$

In other words, the image magnification factor of the aplanatic surface is a square of a ratio of the refractive index of the medium located in front of the aplanatic refracting surface to that therebehind. Therefore, when light is incident through air on the aplanatic surface of a medium having the refractive index n, a magnification factor is $(1/n)^2$. However, when light exits from the medium having the refractive index n to air, a magnification factor of the surface is $n^2$.

According to this aspect, the property of such an aplanatic surface is utilized to obtain a combination of the aplanatic surface and monocentric reflecting and refracting surfaces, thereby realizing a reflection type projection optical system having a high reduction or magnification factor.

In a reflection optical system having monocentric optical surfaces and object and image points located in a plane which is perpendicular to an optical axis and which includes the centers of the monocentric optical surfaces, the optical properties of the system can be expressed as:

$$IV = III + P$$

where IV is the sagittal aberration, III is the astigmatism and P is the Petzval sum.

When the object point on the optical axis of the reflecting or refracting surface of interest is aligned with the curvature center thereof, the following relation is established:

$$I = II = 0$$

where I is the spherical aberration and II is the coma.

Since the sagittal pencil is incident at an angle of 90°, it passes through the surface without being regularly reflected or refracted, so that $$IV = 0$$

A refracting surface having an infinite radius of curvature and the curvature center located at the object or image point or at a conjugate position therewith along the axis of the entire optical system satisfies the following relation, since an incident height h of the paraxial marginal ray is 0:

$$I = II = III = 0$$

At the same time, since the radius of curvature is infinite, $$P = 0$$

Relation IV = 0 is derived from relation IV = III + P.

In the reflection optical system having monocentric optical surfaces and object and image points located in a plane which is perpendicular to an optical axis and which includes the centers of the monocentric optical surfaces, the radii of curvature of the monocentric reflecting and refracting surfaces are properly selected to establish P = 0, thereby realizing an optical system which satisfies the following relation:

$$I = II = III = P = IV = 0$$

The aplanatic refracting surface satisfies the following relation:

$$I = II = III = 0$$

When the radius of curvature of the aplanatic refracting surface is selected to cancel the Petzval sum based on only the aplanatic refracting surface so as to set the sum to zero, i.e., when P = 0 is established, the sagittal aberration IV caused by only the aplanatic refracting surface is given as follows since IV=III+P:

IV=0

When a plurality of aplanatic refracting surfaces are formed in the optical system of the present invention, the Petzval sum for only the aplanatic refracting surfaces must be separately corrected. Still another feature of the present invention is to satisfy the following condition:

$$\sum_{i=1}^{k} (Ni' - Ni)/RiNiNi' = 0$$

where Ri is the radius of curvature of the aplanatic refracting surface, Ni is the refractive index of the front space along the beam propagation direction, Ni' is the refractive index of the rear space, and K is the number of aplanatic refracting surfaces in the entire optical system.

Furthermore, the Petzval sum of the refracting and reflecting surfaces excluding the aplanatic refracting surfaces must also be corrected. More particularly, this Petzval sum must satisfy the following condition:

$$\sum_{i=1}^{L} (Ni' - Ni)/riNiNi' = 0$$

where ri is the radius of curvature of the reflecting and refracting surfaces excluding the aplanatic refracting surfaces, and L is the number of reflecting and refracting surfaces excluding the aplanatic refracting surfaces in the entire optical system.

DESCRIPTION OF THE PREFERRED EMBODIMENTS

Figure 1:
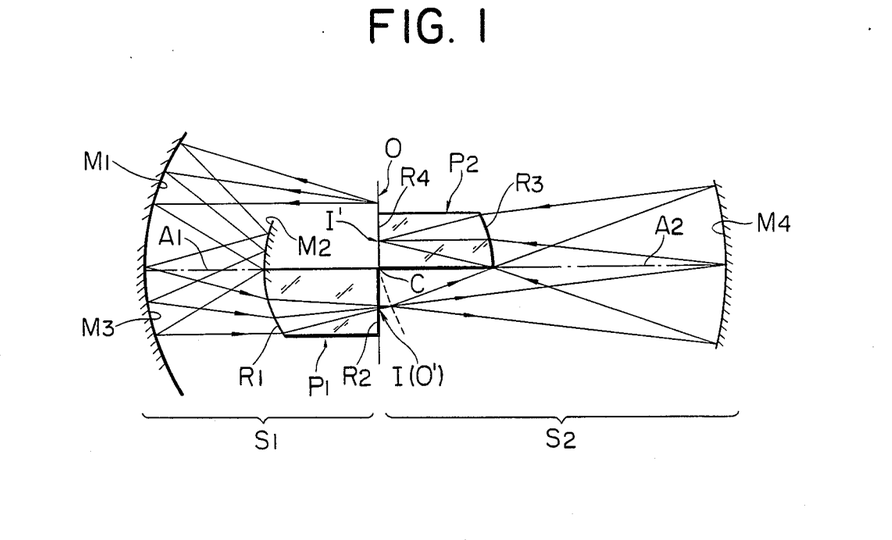
FIG. 1 is a diagram of a reflection type reduction projection optical system according to a first embodiment of the present invention.

FIG. 1 shows a reflection type reduction projection optical system according to a first embodiment of the present invention. The first embodiment exemplified is the simplest configuration of the present invention. Light from an object point of a first optical subsystem S1 is converged by a concave first reflecting surface M1. The light is scattered by a convex second reflecting surface M2 and is converged by a concave third reflecting surface M3. The light is refracted by a first refracting member P1 to form an image I of the first optical subsystem on an ideal image plane on an exit plane R2. In this case, the focusing magnification $\beta 1$ is given as follows:

$$\beta 1 = -1/n1$$

where n1 is the refractive index of the first refracting member P1. The image I serves as an object O' of a second optical subsystem S2. Light from the object O' is converged by a concave fourth reflecting surface M4 and is refracted by a second refracting member P2, thereby forming an object image I' on an exit surface R4. In this case, the focusing magnification factor 82 of the second optical subsystem S2 is given as follows:

$$\beta 2 = -1/n2$$

where n2 is the refractive index of the second refracting member P2. Therefore, a total magnification factor of the entire system is given as follows:

$$\beta T = 1/(n1 \cdot n2)$$

If the refractive index of the first refracting member P1 is the same as that of the second refracting member P2 and is n, the total reduction factor of the entire system is $n^2$.

When the fourth reflecting surface M4 of the second optical subsystem S2 serves as the numerical aperture of the entire system, i.e., in order to obtain a telecentric system at the image side, light emitted along the optical axis of the fourth reflecting surface M4 must be incident so as to be perpendicular to the image plane I', i.e., to be parallel to the optical axis. In other words, equation (1) must be satisfied:

$$n/RM4 - (n-1)/RP2 = 0 \qquad (1)$$

where RM4 is the radius of curvature of the fourth reflecting surface M4 and the RP2 is the radius of curvature of the incident surface R3 of the second refracting member P2.

A light propagation direction from the left to the right is defined as a positive direction. A radius of curvature of the convex surface facing in the left direction is defined as a positive radius of curvature, while a radius of curvature of the concave surface facing in the left direction is defined as a negative radius of curvature. A medium has a positive refractive index when light propagates in the positive direction. However, when light propagates in the negative direction, a medium has a negative refractive index.

The Petzval sum of the second optical subsystem S2 is given as follows:

$$PZ2 = 2/RM4 = (n-1)/(n \cdot RP2) \qquad (2)$$

Substitution of equation (1) into equation (2) yields the following:

$$PZ2 = 1/RM4 < 0 \quad (3)$$

As long as a telecentric arrangement at the image side is given, the second optical subsystem S2 has essentially a negative Petzval sum.

The Petzval sum of the first optical system S1 is given as follows:

$$PZ1 = -2/RM1 + -2/RM2 - 2/RM3 + (n-1)/(n \cdot PR1) \quad (4)$$

For simplicity, the radius of curvature of the first reflecting surface is the same as that of the third reflecting surface, i.e., RM1=RM3 is established. At the same time, the radius of curvatue of the second reflecting surface is the same as that of the incident surface R1 of the first refracting member, i.e., RM2=PR1 is established. Under these conditions, $$PZ1 = -4/RM1 + 2/RM2 + (n-1)/(n \cdot RM2) \quad (5)$$

If the refractive index of the first refractive member is given as n=1.5, the Petzval sum of the first optical subsystem S1 is $$PZ1 < 0$$

as long as the following condition is satisfied:

$$12/7 \approx 1.7 < RM1/RM2$$

When a magnification difference of 1.7 times or more is given for the radii RM1 and RM2 of the first and second reflecting surfaces to allow reciprocal reflection therebetween, the first optical subsystem S1 has essentially a positive Petzval sum.

Since the Petzval sums of the first and second optical subsystems have different signs, the total Petzval sum of the entire system can be corrected by combining the Petzval sums of the first and second optical subsystems. More particularly, the radii of curvatures of the first and second optical subsystems are selected such that a sum PZT of the petzuel sum PZ2 of the second optical subsystem which is given by equation (2) and the Petzval sum PZ1 of the first optical subsystem which is given by equation (4) is set to zero, thereby completely correcting the total Petzval sum of the entire system:

$$PZT = PZ1 + PZ2 = 0$$

As is apparent from the above theory, the first and second optical subsystems, independently, have their own reduction factors in principle, and these subsystems are combined to cancel the Petzval sums. As a result, the total Petzval sum of the entire system can be properly corrected. This can also be understood from FIG. 1. According to light rays representing a conjugate relationship between the object point and the image point in FIG. 1, the focusing point of the first optical subsystem S1 is in a plane slightly deviated from the ideal image plane I and not perpendicular to the optical axis. However, the focusing point of the second optical subsystem lies on the image plane I' which is substantially perpendicular to the optical axis. It can thus be readily understood that a combination of the first and second optical subsystems effectively corrects the curvature of field.

The numerical data of the first embodiment are shown in Table 1. In the following tables including Table 1, the radii of curvature, surface distances and refractive indices of the respective curved surfaces from the object plane O to the final image plane I' are listed. In the tables, the radii of curvature and the refractive indices of the respective surfaces are positive along the light propagation direction from left to right. In this manner, the positive and negative values of the radii and refractive indices are determined with reference to the predetermined light propagation direction. A medium has a positive surface distance when the light propagation direction is positive. However, when the light propagation direction is negative, a medium has a negative surface distance.

TABLE 1
(First Embodiment)

| No. | Radius of Curvature | | Surface Distance | Refractive Index | |
|---|---|---|---|---|---|
| | (Object Plane O) | | −100.000 | −1.000 | S1 |
| 1 | $M_1$ | 100.000 | 50.000 | 1.000 | |
| 2 | $M_2$ | 50.000 | −50.000 | −1.000 | |
| 3 | $M_3$ | 100.000 | 50.000 | 1.000 | |
| 4 | $R_1$ | 50.000 | 50.000 | 1.500 | |
| 5 | $R_2$ | ∞ | 0.000 | 1.000 | |
| | (Image Plane I) | | 150.000 | 1.000 | S2 |
| 6 | $M_4$ | −150.000 | −100.000 | −1.000 | |
| 7 | $R_3$ | −50.000 | −50.000 | −1.500 | |
| 8 | $R_4$ | ∞ | 0.000 | −1.000 | |
| | (Image Plane I') | | | | |

PZ1 = 0.00667  PZ2 = −0.00667
PZT = PZ1 + PZ2 = 0.000

It is apparent that the total Petzval sum is completely corrected by a combination of the first and second optical subsystems S1 and S2.

Figure 2:
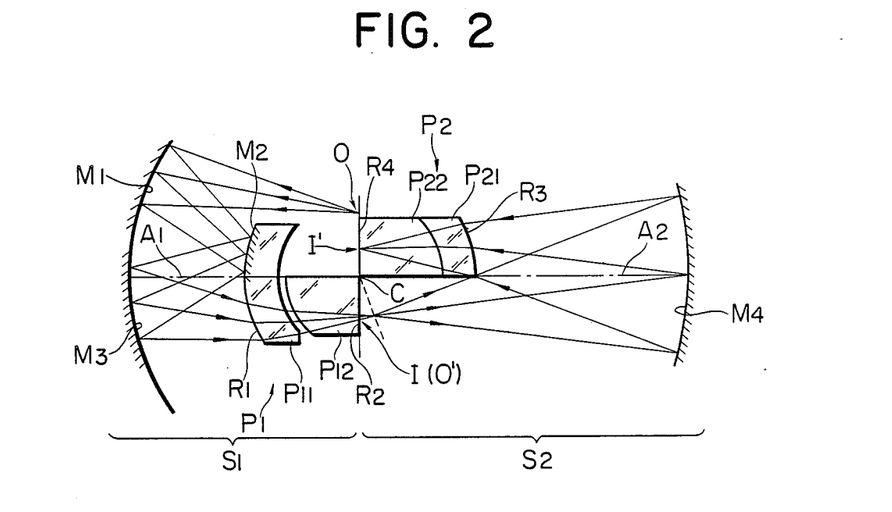
FIG. 2 is a diagram of a reflection type reduction projection optical system according to a second embodiment of the present invention.

FIG. 2 shows a basic configuration of a reflection type reduction projection optical system according to a second embodiment of the present invention. The same reference numerals in the second embodiment denote the same parts as in the first embodiment. According to the second embodiment, each of first and second refracting members P1 and P2 comprises a group of separate or joined, refracting members to improve chromatic aberration. In the optical system of the present invention, since the reflecting unit has a high power, it is easy to eliminate chromatic aberration when a system is designed with consideration for chromatic aberration. The refracting and reflecting surfaces of the optical system are monocentrically arranged, and flat refracting surfaces are substantially coincident with an image plane perpendicular to the optical axis and including the monocentric center. Chromatic aberration on the optical axis will not substantially occur irrespective of scattering by the respective refracting members. Therefore, it is essential to correct chromatic aberration in magnification factors. The arrangement of the second embodiment of FIG. 2 aims at properly correcting chromatic aberration in magnification factors. For this purpose, the first refracting member P1 comprises a monocentric meniscus lens member P11 and a positive lens member P12 located slightly distant from the lens member P11. The second refracting member P2 comprises a monocentric meniscus lens member P21 and a positive lens member P22 combined therewith. The optical system arrangement is not limited to that illustrated in FIG. 2, but can be extended to an arrangement wherein two or more refracting members are separated or combined to provide each of predetermined first and second refracting members. In order to correct chromatic aberration, the separation surfaces and contact surfaces of the refracting members need not be monocentric. In the following embodiment, monochromatic light is exemplified for simplicity since chromatic aberration can be independently corrected if a proper focusing property for the reference light ray is guaranteed. Chromatic aberration is not specifically considered.

Figure 3:
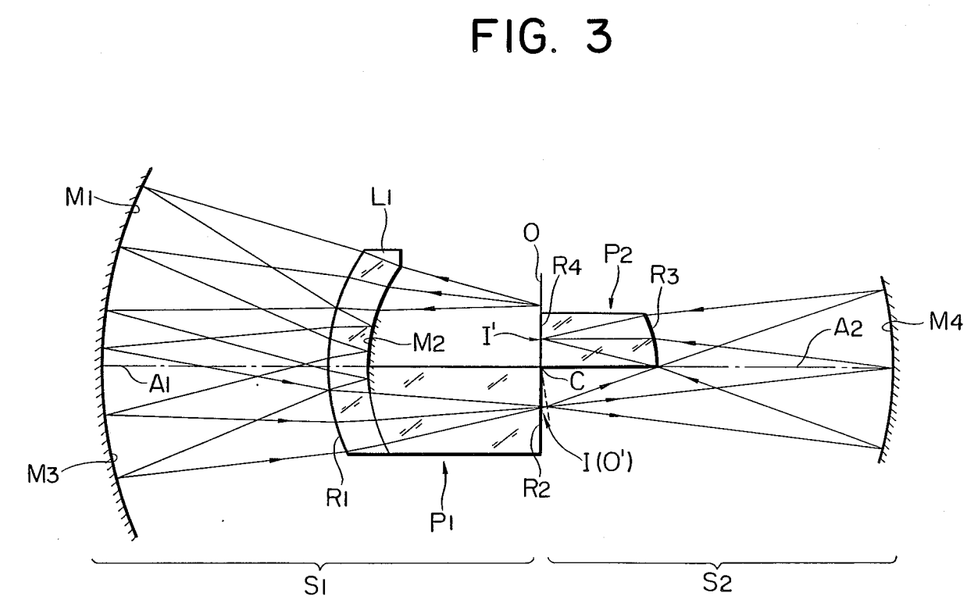
FIG. 3 is a diagram of a reflection type reduction projection optical system according to a third embodiment of the present invention.

In an arrangement of a third embodiment shown in FIG. 3, a monocentric meniscus lens member L1 is inserted between an object plane O and a first reflecting surface M1 of a first optical subsystem. A convex second reflecting surface M2 constitutes the rear reflecting surface of the same member as the meniscus lens member L1. In the basic arrangement described with reference to FIG. 1, the meridional image plane is curved due to high-order aberration. However, by employing the monocentric meniscus lens member of the third embodiment, the curvature of the meridional image plane can be greatly decreased.

Figure 4:
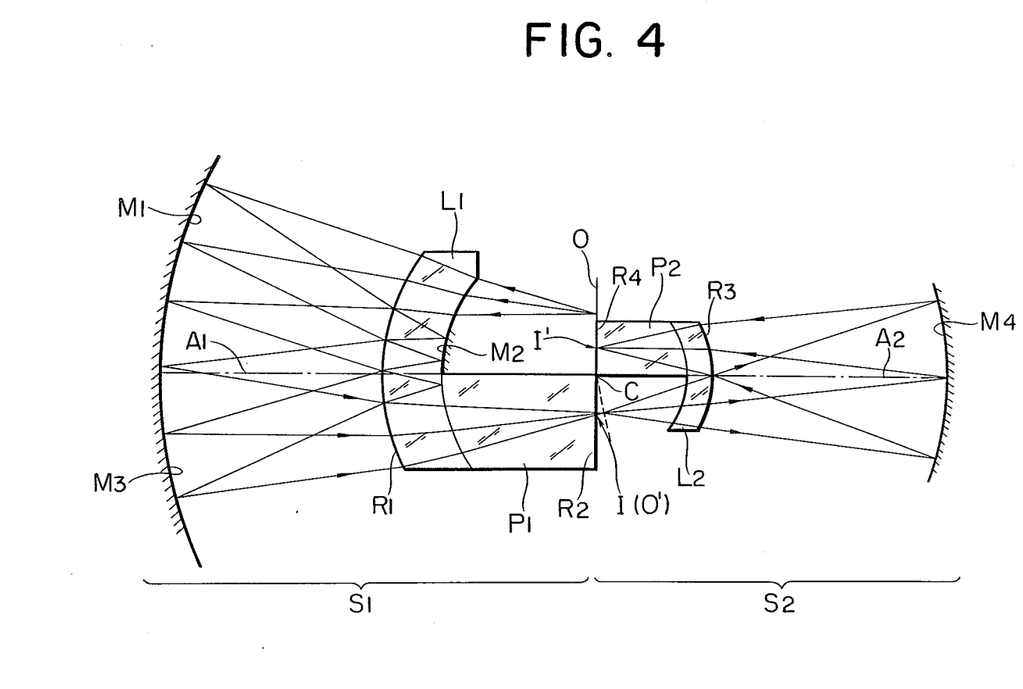
FIG. 4 is a diagram of a reflection type reduction projection optical system according to a fourth embodiment of the present invention.

In an arrangement of a fourth embodiment shown in FIG. 4, a monocentric meniscus lens member L2 is also arranged between a fourth reflecting surface M4 of a second optical subsystem S2 and an object plane O' (i.e., an image plane I of a first optical subsystem S1) of the second optical subsystem S2. The meniscus lens member L2 has the same radius of curvature as that of a monocentric incident refracting surface R3 of a second refracting member P2. By adding the meniscus lens member L2 to obtain the arrangement of the fourth embodiment, the object point and the image point can be formed near the optical axis without causing eclipse. In general, a good image can be obtained in a coaxial optical system when the object and image points are formed near the optical axis. Therefore, focusing can be greatly improved.

Numerical data of the fourth embodiment are shown in Table 2 below. The same denotation as in Table 1 is employed in Table 2. In the respective optical subsystems, the contact surfaces between refracting members P1 and P2 and meniscus lens members L1 and L2 are It is apparent that the total Petzval sum is completely corrected by a combination of the first and second optical subsystems.

Figure 5:
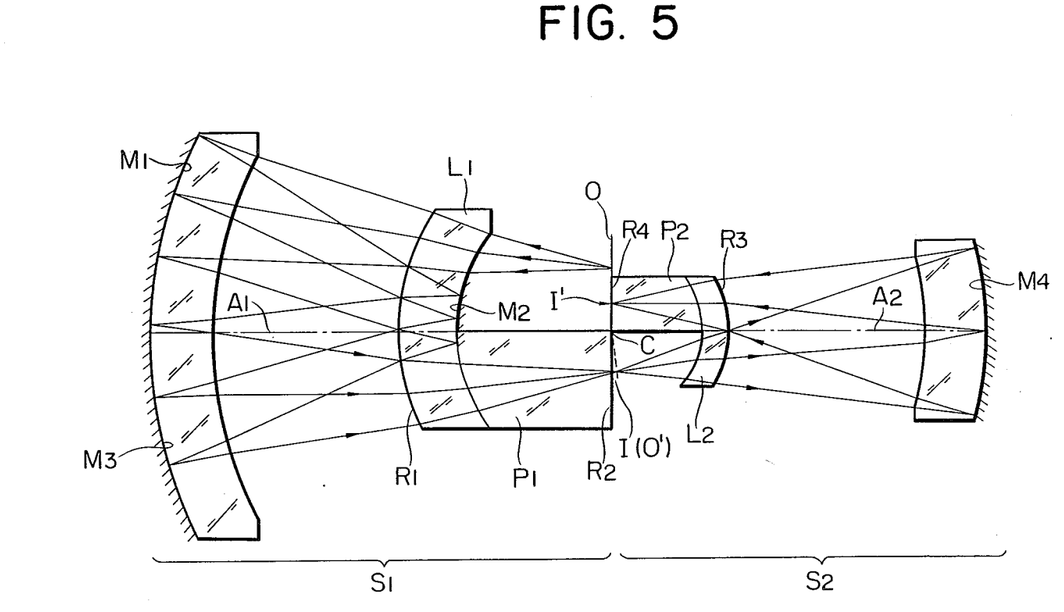
FIG. 5 is a diagram of a reflection type reduction projection optical system according to a fifth embodiment of the present invention.

In an arrangement of a fifth embodiment shown in FIG. 5, the respective concave reflecting surfaces of first and second optical subsystems serve as rear reflecting surfaces. With this arrangement, spherical aberration of a higher order caused by an out-of-axis pencil can be effectively corrected.

Figure 6:
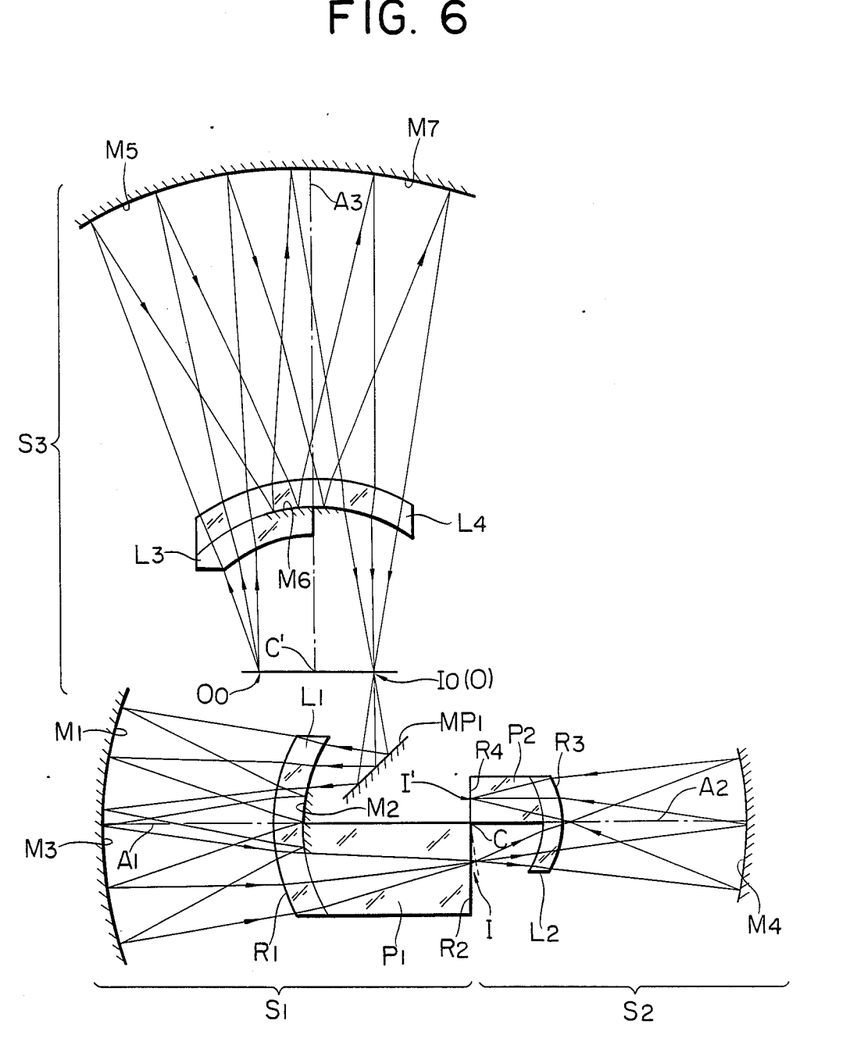
FIG. 6 is a diagram of a reflection type reduction projection optical system according to a sixth embodiment of the present invention.

In an arrangement of a sixth embodiment shown in FIG. 6, a third optical subsystem S3 having a magnification factor of 1 is added to the arrangement of FIG. 4. All reflecting and refracting surfaces of the third optical subsystem S3 are substantially monocentrically arranged. A monocentric center C' of these reflecting and refracting surfaces is located at a position optically equivalent to a monocentric center of a reflection type reduction system. More particularly, the third optical subsystem S3 has a concave fifth reflecting surface M5, a convex sixth reflecting surface M6 and a concave seventh reflecting surface M7. In order to provide a margin for aberration correction, monocentric meniscus lens members L3 and L4 are arranged in the third optical subsystem S3. With this arrangement, the third optical subsystem S3 has a positive Petzval sum while the second optical subsystem S2 essentially has a negative Petzval sum. At the same time, the first optical subsystem S1 has a positive Petzval sum, thereby correcting the total Petzval sum of the entire system. A slight distortion occurs in the arrangement of FIG. 4 However, in the arrangement of the sixth embodiment, the optical surfaces along the forward path are asymmertical along the path in the third optical system S3, thereby decreasing the distortion.

Numerical data of the sixth embodiment are given in Table 3. This table employs the same denotation as Table 2. The flat reflecting mirror is not essential in optical design.

TABLE 2

| | | (Fourth Embodiment) | | | |
|---|---|---|---|---|---|
| No | | Radius of Curvature | Surface Distance | Refractive Index | |
| | | (Object Plane O) | −66.667 | −1.000 | $S_1$ |
| | $L_1$ | 66.667 | −24.242 | −1.500 | |
| 2 | $L_1$ | 90.909 | −96.591 | −1.000 | |
| 3 | $M_1$ | 187.500 | 96.591 | 1.000 | |
| 4 | | 90.909 | 24.242 | 1.500 | |
| 5 | $M_2$ | 66.667 | −24.242 | −1.500 | |
| 6 | | 90.909 | −96.591 | −1.000 | |
| 7 | $M_3$ | 187.500 | 96.591 | 1.000 | |
| 8 | $R_1$ | 90.909 | 90.909 | 1.500 | |
| 9 | $R_2$ | ∞ | 0.000 | 1.000 | |
| | | (Image Plane I) | 40.000 | 1.000 | $S_2$ |
| 10 | $L_2$ | −40.000 | 10.000 | 1.500 | |
| 11 | $L_2$ | −50.000 | 100.000 | 1.000 | |
| 12 | $M_4$ | −150.000 | −100.000 | −1.000 | |
| 13 | $R_3$ | −50.000 | −50.000 | −1.500 | |
| 14 | $R_4$ | ∞ | 0.000 | −1.000 | |
| | | (Image Plane I') | | | |

$PZ_1 = 0.00833$  $PZ_2 = -0.00833$

TABLE 3

| | | (Sixth Embodiment) | | | |
|---|---|---|---|---|---|
| No. | | Radius of Curvature | Surface Distance | Refractive Index | |
| | | (Object Plane $O_0$) | 74.500 | 1.000 | $S_3$ |
| 1 | $L_3$ | −74.500 | 30.500 | 1.500 | |
| 2 | $L_3$ | −105.000 | 167.000 | 1.000 | |
| 3 | $M_5$ | −272.000 | −167.000 | −1.000 | |
| 4 | | −105.000 | −15.000 | −1.500 | |
| 5 | $M_6$ | −90.000 | 15.000 | 1.500 | |
| 6 | | −105.000 | 167.000 | 1.000 | |
| 7 | $M_7$ | −272.000 | −167.000 | −1.000 | |
| 8 | $L_4$ | −105.000 | −15.000 | −1.500 | |
| 9 | $L_4$ | −90.000 | −90.000 | −1.000 | |
| | | (Image Plane $I_0$) | −90.000 | −1.000 | $S_1$ |
| 10 | $L_1$ | 90.000 | −15.000 | −1.500 | |
| 11 | $L_1$ | 105.000 | −93.947 | −1.000 | |
| 12 | $M_1$ | 198.947 | 93.947 | 1.000 | |
| 13 | | 105.000 | 15.000 | 1.500 | |
| 14 | $M_2$ | 90.000 | −15.000 | −1.500 | |
| 15 | | 105.000 | −93.947 | −1.000 | |
| 16 | $M_3$ | 198.947 | 93.947 | 1.000 | |
| 17 | $R_1$ | 105.000 | 105.000 | 1.500 | |
| 18 | $R_2$ | ∞ | 0.000 | 1.000 | |
| | | (Image Plane I) | 40.000 | 1.000 | $S_2$ |
| 19 | $L_2$ | −40.000 | 10.000 | 1.500 | |
| 20 | $L_2$ | −50.000 | 100.000 | 1.000 | |
| 21 | $M_4$ | −150.000 | −100.000 | −1.000 | |
| 22 | $R_3$ | −50.000 | −50.000 | −1.500 | |
| 23 | $R_4$ | ∞ | 0.000 | −1.000 | |
| | | (Image Plane I') | | | |

$PZ_1 = 0.00370$  $PZ_2 = -0.00833$
$PZ_3 = 0.00463$

TABLE 3-continued

| | (Sixth Embodiment) | | |
|---|---|---|---|
| No. | Radius of Curvature | Surface Distance | Refractive Index |
| | $PT_T = PZ_1 + PZ_2 + PZ_3 = 0.000$ | | |

Figure 7:
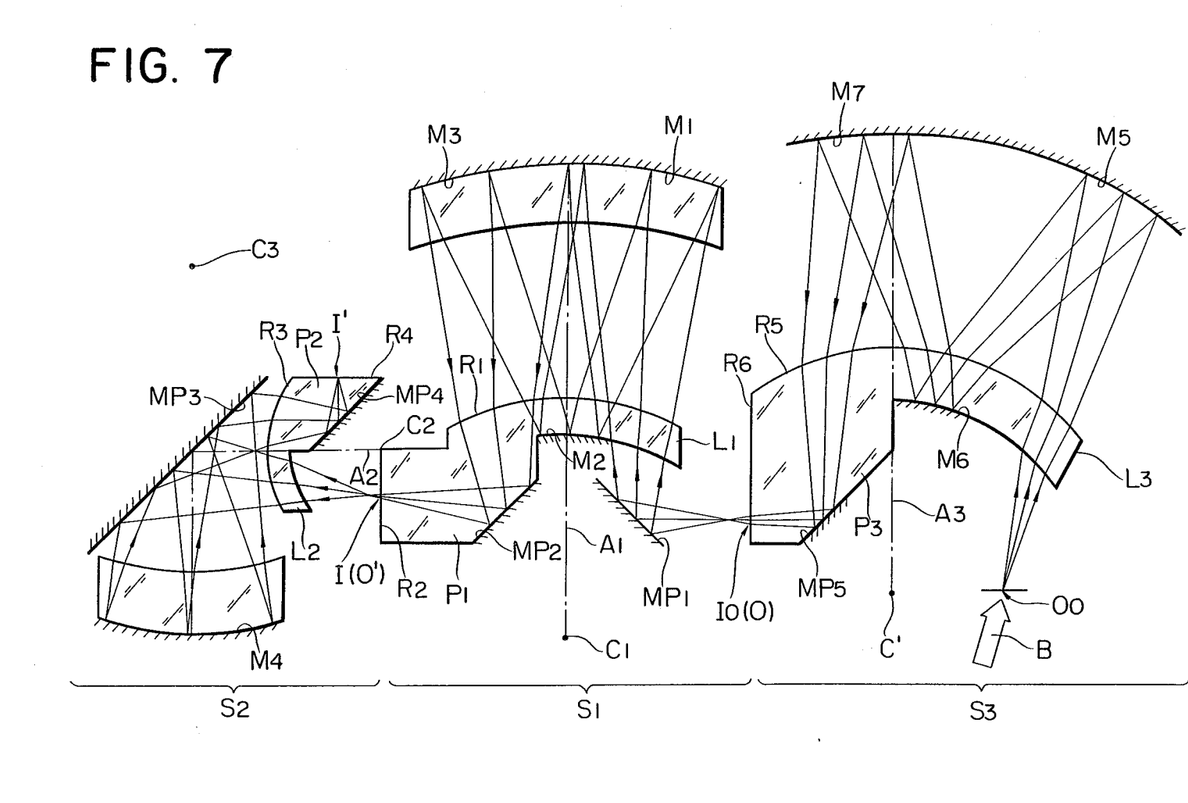
FIG. 7 is a diagram of a reflection type reduction projection optical system according to a seventh embodiment of the present invention.

In a seventh embodiment shown in FIG. 7, a third optical subsystem S3 comprises a reduction type reflection optical system. The same reference numerals in FIG. 7 denote the same parts as the above embodiments The third optical subsystem S3 comprises the same optical system as the first optical system S3. When a refractive index of a third refracting member P3 located at the image side of the third optical system is given as n in the same manner as for other refracting members P1 and P2, a total magnification of the entire optical system is:

$$\beta T = -1/n^3$$

The first optical subsystem S1 is the same system as in FIG. 5, except that an inclined flat reflecting mirror MP1 is arranged such that an object plane O is parallel to an optical axis A1. In addition, a reflecting surface MP2 is formed in the first refracting member P1 to set an image plane I to be parallel to the optical axis A1, and an exit surface R2 of the first refracting member P1 is parallel to the optical axis A1. The first refracting member P1 and the meniscus lens member L1 are made of a single material and are formed integrally with each other. The second optical subsystem S2 is the same subsystem as in FIG. 5, except that an optical path is bent at a right angle by a large inclined relfecting mirror MP3. The second refracting member P2 has a reflecting plane MP4, and an image surface I' is parallel to an optical axis A2.

The third optical subsystem S3 has a concave fifth reflecting surface M5, a convex sixth reflecting surface M6 and a concave seventh reflecting surface M7. The third refracting member P3 is arranged between the seventh reflecting plane M7 and an image plane I0 of the third optical subsystem. The third refracting member P3 has an incident refracting surface R5, with a monocentric center C' and an exit surface R6 parallel and substantially coincident with the image plane I0. In this embodiment, the fifth reflecting surface M5 and the seventh reflecting surface M7 have an identical radius of curvature and constitute identical concave reflecting surfaces. A monocentric meniscus lens member L3 is arranged between an object plane O0 and the fifth reflecting surface M5. The meniscus lens member L3 is of the same material as the third refracting member P3 and is formed integrally therewith.

A monocentric center C1 of the first optical subsystem S1 is equivalent to a monocentric center C2 of the second optical subsystem S2 with respect to the flat reflecting surface MP2 formed in the first refracting member. A monocentric center C3 of the fourth reflecting surface M4 is equivalent to the center C2 with respect to the flat mirror MP3. A monocentric center C' of the third optical subsystem S3 is equivalent to a monocentric center C1 of the first optical subsystem S1 with respect to the flat mirror MP1 and a flat reflecting surface MP5 in the third refracting member.

According to the arrangement of the seventh embodiment, the object plane O0 is at a different position than the final image plane I' and parallel thereto Therefore, an illumination optical system can be arranged to supply illumination light B to the object plane.

In the above embodiments, the image plane of each optical subsystem is coincident with the exit surface of the corresponding refracting member. However, the image planes and exit surfaces can be separated from each other. In particular, when a semiconductor wafer with a photoresist film is placed at the final image plane, an air gap of about several mm is preferably formed between the final image plane and the exit surface. When such an air gap is formed, an intermediate image is preferably formed inside the refracting member to be located near the intermediate image.

An embodiment will be described wherein an aplanatic refracting surface is provided to obtain a higher reduction or magnification factor.

In the following description, the object plane is located at the reduction side, and the object image is enlarged and projected. Image reduction and enlargement depend on light propagation directions, and the operation thereof is essentially identical.

Figures 8, 9:
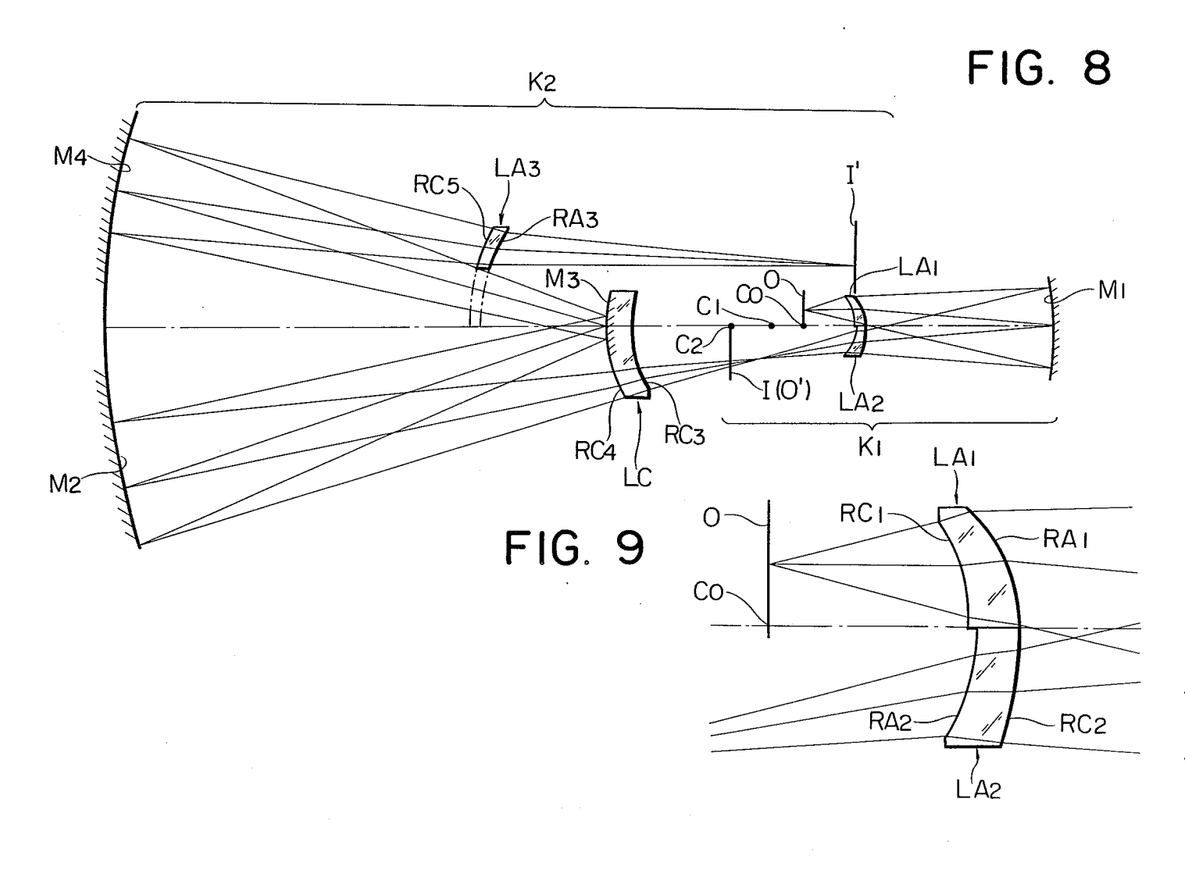
FIG. 8 is a diagram of a reflection type reduction projection optical system according to an eighth embodiment of the present invention.
FIG. 9 is an enlarged view showing part of the system shown in FIG. 8.

An eighth embodiment shown in FIG. 8 exemplifies a reflection type reduction projection optical system having a reduction factor of 1/3.4. This system has a first optical subsystem K1 and a second optical subsystem K2. An enlarged image of an object on the object plane O is formed by the first optical subsystem K1 on the image plane I. The enlarged object image is further enlarged by the second optical subsystem K2 to form an enlarged image on the image plane I'. In this case, the image plane I of the first optical subsystem is coincident with the object plane O' of the second optical subsystem.

In this embodiment, the system comprises a total of 12 refracting and reflecting surfaces. As shown in FIG. 9, the first optical subsystem K1 comprises a first aplanatic lens LA1 and a second aplanatic lens LA2. The first aplanatic lens LA1 comprises a first monocentric refracting surface RC1 and a first aplanatic surface RA1 which is aplanatic for an object point C0. The second aplanatic lens LA2 has a concave first reflecting surface M1 having a curvature center as an image point C1 formed by the aplanatic surface RA1, a second monocentric refracting surface RC2 having the same center as that of the first reflecting surface M1, and a second aplanatic surface RA2 aplanatic for the image point C1 formed by the second refracting surface RC2.

The second optical subsystem K2 comprises a monocentric lens LC, a concave second reflecting surface M2, a convex third reflecting surface M3, a concave fourth reflecting surface M4, and a third aplanatic lens LA3. The monocentric lens LC has a third monocentric refracting surface RC3 having its curvature center as an image point formed by the aplanatic surface RA2, and a fourth monocentric refracting surface RC4. The second reflecting surface M2 has a curvature center as the image point C2 formed by the lens LC. The curvature center of the reflecting surface M2 is coincident with that of the third reflecting surface M3. The curvature center of the third reflecting surface M3 is coincident with that of the fourth reflecting surface M4. The reflecting surface M3 is arranged opposing the reflecting surfaces M2 and M4. The third aplanatic lens LA3 has a fifth monocentric refracting surface RC5 whose curvature center is coincident with that of the reflecting surface M4, and a third aplanatic surface RA3 which is aplanatic for the image point C2.

With this arrangement, when the conjugate relationship between the three aplanatic surfaces RA1, RA2 and RA3 is considered, the system as a whole can be regarded as an optical system having reflecting and refracting surfaces which are substantially monocentric with each other. It should be noted that the object plane O side is telecentric in this embodiment.

Referring to FIG. 8, the reflecting surfaces M2 and M4 need not be located on a common curved surface. In the above embodiment, the reflecting surface M3 has the same radius of curvature as that of the exit surface RC4. However, the radius of curvature of the surface M3 need not be the same as that of the surface RC4.

The numerical data of the eighth embodiment are shown in Table 4 below. In Table 4, the magnifications of the respective surfaces are also listed.

TABLE 4

(Eighth Embodiment)

| No. | | Radius of Curvature | Surface Distance | Refractive Index | Image Magnification Factor of Surface |
|---|---|---|---|---|---|
| | $K_1$ | (Object Plane O) | 40.00 | 1.00 | |
| 1 | $R_{C1}$ | −40.00 | 10.00 | 1.50 | 1/1.5 |
| 2 | $R_{A1}$ | −30.00 | 149.62 | 1.00 | $(1.5/1)^2$ |
| 3 | $M_1$ | −224.623 | −149.62 | −1.00 | −1 |
| 4 | $R_{C2}$ | −75.000 | −8.33 | −1.50 | −1/−1.5 |
| 5 | $R_{A2}$ | −40.000 | −100.00 | −1.00 | $(-1.5/-1)^2$ |
| | | (Image Plane I) | −80.00 | −1.00 | |
| 6 | $R_{C3}$ | 80.000 | −20.00 | −1.50 | −1/−1.5 |
| 7 | $R_{C4}$ | 100.000 | −400.00 | −1.00 | −1.5/−1 |
| 8 | $M_2$ | 500.000 | 400.00 | 1.00 | −1 |
| 9 | $M_3$ | 100.000 | −400.000 | −1.00 | −1 |
| 10 | $M_4$ | 500.000 | 295.00 | 1.00 | −1 |
| 11 | $R_{C5}$ | 205.000 | 5.00 | 1.50 | 1/1.5 |
| 12 | $R_{A3}$ | 120.000 | 300.00 | 1.00 | $(1.5/1)^2$ |
| | $K_2$ | (Image Plane I') | | | |

Magnification of entire system = $(1.5)^3$ = 3.375

The magnification factors are given in the order opposite to the light propagation direction, so that the image size is increased. However, a reduction projection at a factor of 1/3.375 can be performed in this system.

The total focal length of the entire system of the eighth embodiment is given as f=243.789. The total focal length is normalized to be f=1.0, thereby showing a calculated result of a third order aberration coefficient in Table 5. If an inclined angle of the paraxial marginal light ray on the object plane, as is required for the aberration calculation is α0, a height from the optical axis is h0, an inclined angle of the paraxial major light ray on the object plane is $\bar{\alpha}0$, and a height from the optical axis is $\bar{h}0$, h0=0 is established when the object plane is given as the 0th surface. Furthermore, since the telecentric arrangement is provided at the object side, the values α0 and $\bar{h}0$ are used to only multiply the aberration coefficient with a given constant, so that the following initial values are used to calculate the third order aberration coefficients:

α0 = −1, h0 = 0

$\bar{\alpha}0$ = 0, $\bar{h}0$ = 1

TABLE 5

(Third Order Aberration Coefficients of Eighth Embodiment)

| | I | II | III | P | V |
|---|---|---|---|---|---|
| 1 | 0.000 | 0.000 | 2.032 | −2.032 | 20.636 |
| 2 | 0.000 | 0.000 | 0.000 | 2.709 | −27.514 |
| 3 | 0.000 | 0.000 | 2.171 | −2.171 | 0.000 |
| 4 | 0.000 | 0.000 | −1.084 | 1.084 | 13.208 |
| 5 | 0.000 | −0.000 | 0.000 | −2.032 | −27.018 |
| 6 | 0.000 | 0.000 | 1.016 | −1.016 | 26.117 |
| 7 | 0.000 | 0.000 | −0.813 | 0.813 | −16.715 |
| 8 | 0.000 | 0.000 | 0.975 | −0.975 | 0.001 |
| 9 | 0.000 | −0.000 | −4.876 | 4.876 | −0.000 |
| 10 | 0.000 | 0.000 | 0.975 | −0.975 | 0.001 |
| 11 | 0.000 | 0.000 | −0.396 | 0.396 | 3.977 |
| 12 | 0.000 | −0.000 | 0.000 | −0.677 | −12.735 |
| Σ | 0.000 | −0.000 | 0.000 | 0.000 | −20.043 |

Four aberrations of sharpness among Seidel's five aberrations can be properly corrected by using the third order aberration coefficients.

Figure 10:
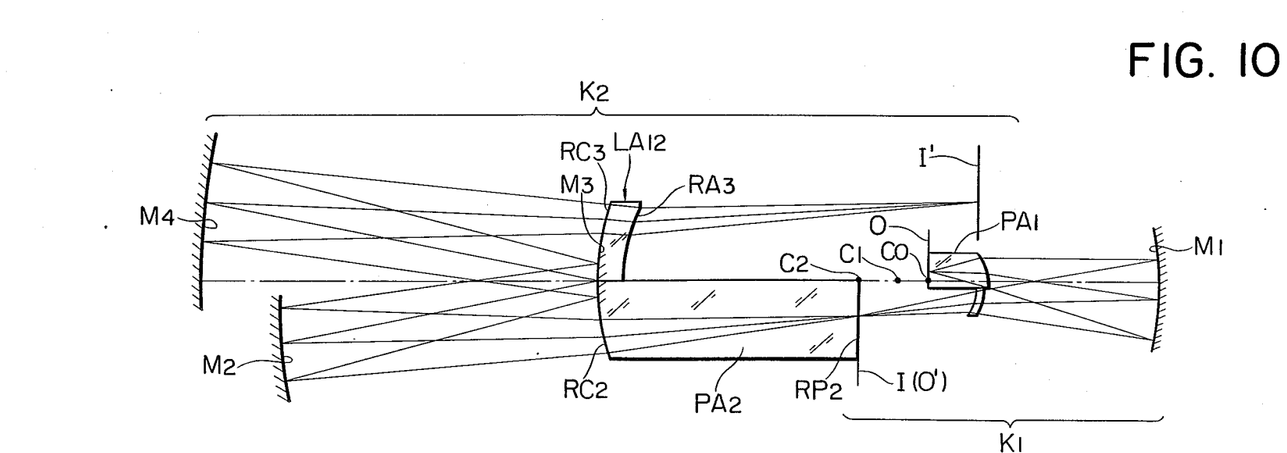
FIG. 10 is a diagram of a reflection type reduction projection optical system according to a ninth embodiment of the present invention.

In a ninth embodiment shown in FIG. 10, a reflection type reduction projection optical system having a reduction factor of 1/7.6 is exemplified wherein a flat refracting surface is aligned with or located near the object plane. Optical subsystems K1 and K2 are basically similar to those of the eighth embodiment. However, the system of FIG. 10 includes a refracting surface with an infinite radius of curvature formed near the conjugate surface in each subsystem, instead of the monocentric refracting surface. This flat refracting surface is located near the object or image plane at the reduction side of each subsystem. The image plane of the first optical system is coincident with the object plane of the second optical subsystem. An enlarged image of the object on the object plane O is formed by the first optical subsystem on the image plane I. The enlarged object image is further enlarged by the second optical subsystem K2 on the image plane I'.

Figure 11:
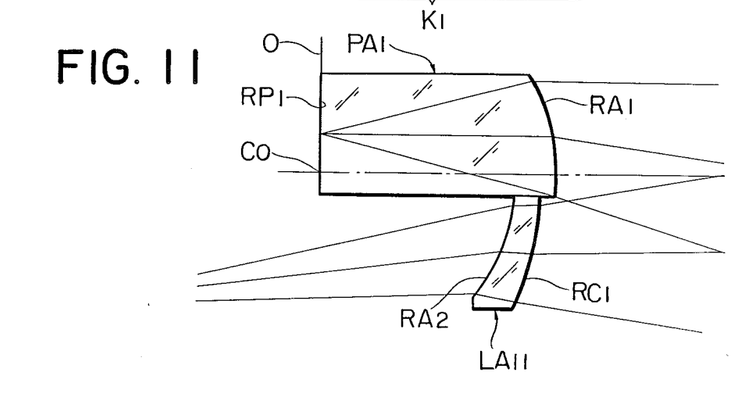
FIG. 11 is an enlarged view showing part of the system shown in FIG. 10.

The system of the ninth embodiment has a total of 12 refracting and reflecting surfaces. A first optical subsystem K1 comprises a first refracting member PA1, a concave first reflecting surface M1 and a first aplanatic lens LA11. The first refracting member PA1 has a first flat refracting surface RP1 aligned with the object surface and a first aplanatic surface RA1 which is aplanatic for an object point C0 on the axis. The concave first reflecting surface M1 has a curvature center coincident with an image point C1 formed by the aplanatic surface RA1. The first aplanatic lens LA11 has a first monocentric refracting surface RC1 having the same center as that of the reflecting surface M1, and a second aplanatic surface RA2 which is aplanatic for the image point C1 formed by the refracting surface RC1.

A second optical subsystem K2 comprises a second refracting member PA2, a concave second reflecting surface M2, a convex third reflecting surface M3, a concave fourth reflecting surface M4 and a second aplanatic lens LA12. The second refracting member PA2 has a second flat refracting surface RP2 which is aligned with an image point C2 formed by the aplanatic surface RA2 and which is perpendicular to the optical axis, and a second monocentric refracting surface RC2 whose curvature center is coincident with the image point C2. The second reflecting surface M2 has a curvature center coincident with the image point C2 formed by the refracting member PA2. The third reflecting surface M3 has the curvature center coincident with that of the reflecting surface M2. The fourth reflecting surface M4 has the curvature center coincident with that of the reflecting surface M3. The reflecting surface M3 is arranged to oppose the reflecting surfaces M2 and M4. The second aplanatic lens LA12 has a third monocentric refracting surface RC3 whose curvature center is coincident with that of the reflecting surface M4 and a third aplanatic surface RA3 which is aplanatic for the image point C2 formed by the refracting surface RC3.

With this arrangement, when the conjugate relationship between the three aplanatic surfaces RA1, RA2 and RA3 is considered except for the flat refracting surfaces arranged to substantially align with the object or image plane, the system of this embodiment can be regarded as an optical system having the reflecting and refracting surfaces which are essentially monocentric with each other. It should be noted that the telecentric arrangement is provided at the object O side.

In the arrangement shown in FIG. 10, the object planes O and O' of the respective optical subsystems are coincident with the incident surfaces of the corresponding refracting members PA1 and PA2. However, the planes O and O' may be slightly separated from the members PA1 and PA2.

The numerical data of the ninth embodiment are summarized in Table 6.

TABLE 6
(Ninth Embodiment)

| No. | | Radius of Curvature | Surface Distance | Refractive Index | Image Magnification Factor of Surface |
|---|---|---|---|---|---|
| | $K_1$ | (Object Plane O) | 0.00 | 1.00 | |
| 1 | $R_{P1}$ | ∞ | 50.00 | 1.50 | 1 |
| 2 | $R_{A1}$ | −30.000 | 145.00 | 1.00 | $(1.5/1)^2$ |
| 3 | $M_1$ | 220.000 | −148.33 | −1.00 | −1 |
| 4 | $R_{C1}$ | −71.667 | −5.00 | −1.50 | −1/−1.5 |
| 5 | $R_{A2}$ | −40.000 | −100.00 | −1.00 | $(−1.5/−1)^2$ |
| | | (Image Plane I) | | | |
| 6 | $R_{P2}$ | ∞ | −220.00 | −1.50 | 1 |
| 7 | $R_{C2}$ | 220.000 | −270.00 | −1.00 | −1.5/−1 |
| 8 | $M_2$ | 490.000 | 270.00 | 1.00 | −1 |
| 9 | $M_3$ | 220.000 | −335.58 | −1.00 | −1 |
| 10 | $M_4$ | 555.580 | 335.58 | 1.00 | −1 |
| 11 | $R_{C3}$ | 220.000 | 20.00 | 1.50 | 1/1.5 |
| 12 | $R_{A3}$ | 120.000 | 300.00 | 1.00 | $(1.5/1)^2$ |
| | $K_2$ | (Image Plane I') | | | |

Magnification of entire system = $(1.5)^5$ = 7.5938

The data are sequentially obtained in an order opposite to the light propagation direction, so that the magnification factors are obtained. However, a reduction projection having a reduction factor of 1/7.5938 can be obtained.

In this embodiment, a Petzval sum PZA of the aplanatic refracting surfaces, i.e., the second, fifth and 12th surfaces (RA1, RA2 and RA3) is set to be zero.

$$PZA = \sum_i (1/R_i)(1/N_i - 1/N_i')$$
$$= (-1/30)(1/1.5 - 1/1) + (-1/40)$$
$$(-1/1.5 + 1/1) + (1/120)(1/1.5 - 1/1)$$
$$= 0$$

The total focal length of this embodiment is $f = -184.051$. When the total focal length is normalized to be $f = -1.0$ and the following initial values are used:

$$\alpha 0 = -1, h0 = 0$$
$$\overline{\alpha}0 = 0, \overline{h}0 = 1$$

the calculation results are summarized in Table 7. In the above equation, sigma indicates a sum of the entire system.

TABLE 7
(Third Order Aberration Coefficient of Ninth Embodiment)

| | I | II | III | P | V |
|---|---|---|---|---|---|
| 1 | 0.000 | 0.000 | 0.000 | 0.000 | 0.000 |
| 2 | 0.000 | −0.000 | −0.000 | 2.045 | −28.230 |
| 3 | 0.000 | 0.000 | 1.673 | −1.673 | −0.000 |
| 4 | 0.000 | 0.000 | −0.856 | 0.856 | 18.549 |
| 5 | 0.000 | 0.000 | −0.000 | −1.534 | −39.967 |
| 6 | 0.000 | 0.000 | 0.000 | 0.000 | 7.695 |
| 7 | 0.000 | 0.000 | −0.279 | 0.279 | −9.965 |
| 8 | 0.000 | 0.000 | 0.751 | −0.751 | −0.000 |
| 9 | 0.000 | 0.000 | −1.673 | 1.673 | 0.000 |
| 10 | 0.000 | 0.000 | 0.663 | −0.663 | −0.000 |
| 11 | 0.000 | 0.000 | −0.279 | 0.279 | 9.965 |
| 12 | 0.000 | −0.000 | −0.000 | −0.511 | −26.260 |
| Σ | 0.000 | −0.000 | −0.000 | −0.000 | −68.213 |

Four aberrations of sharpness among Seidel's five aberrations excluding distortion can be properly corrected by using the third order aberration coefficients.

A total Petzval sum of the aplanatic refracting surfaces (i.e., the second, fifth and twelfth surfaces) and a total Petzval sum of the remaining surfaces are independently order aberration coefficients in the same manner as in the eighth and ninth embodiments.

What is claimed is:

1. A reflection type projection optical system, comprising:
   (a) an optical axis; and
   (b) a plurality of optical surfaces having respective centers of curvature on said optical axis, said plurality of optical surfaces being arranged such that an image point determined by a preceding one of said optical surfaces serves as an object point for a next one of said optical surfaces in an optical order from an object to a final image point;
   (c) said plurality of optical surfaces including a plurality of reflecting surfaces and a plurality of refracting surfaces having at least one aplanatic refracting surface;
   the centers of curvature of said plurality of reflecting surfaces being substantially coincident with object points for corresponding reflecting surfaces along said optical axis, the centers of curvature of said refracting surfaces other than said aplanatic refracting surface being substantially coincident with object points for corresponding refracting surfaces along said optical axis.

2. A system according to claim 1 wherein said plurality of refracting surfaces includes a plurality of aplanatic refracting surfaces.

3. A system according to claim 2, wherein said plurality of aplanatic refracting surfaces are arranged to correct a total Petzval sum thereof independently of a total Petzval sum of said refracting surfaces other than said aplanatic refracting surface and said reflecting surfaces, and said refracting surfaces other than said aplanatic refracting surface and said reflecting surfaces are arranged to correct the total Petzval sum thereof independently of the total Petzval sum of said plurality of aplanatic refracting surfaces.

4. A system according to claim 1, further including a flat refracting surface which is located at or near a position optically equivalent to said object and which is perpendicular to said optical axis.

5. A system according to claim 1, further including a flat reflecting surface which is located at or near an image point related to one of said optical surfaces and which is perpendicular to said optical axis.

6. A system according to claim 1, wherein said aplanatic refracting surface is characterized by the formula:

$$R = N s/(N+N') = (n's')/(N+N')$$

where:
  R is a radius of curvature of said aplanatic refracting surface,
  N is a refractive index of a medium located just in front of said aplanatic refracting surface,
  N' is a refractive index of a medium located just behind aplanatic refracting surface,
  s is an object point distance of said aplanatic refracting surface, and
  s' is an image point distance of said aplanatic refracting surface.

7. A reflection type reduction projection optical system, comprising:
  optical subsystem for forming on a first image plane a primary reduced image of an object located at an object plane, said first optical subsystem including a first optical axis substantially perpendicular to said object plane, a first concave reflecting surface, a first convex reflecting surface opposing the first concave reflecting surface, a second concave reflecting surface opposing the first convex reflecting surface said and a first refracting member located between the second concave reflecting surface and said first image plane; said first concave reflecting surface, said first convex reflecting surface and said second concave reflecting surface having a common center of curvature at an intersection of said first optical axis and said object plane, said first refracting member including a first convex refracting surface having a center of curvature coincident with said common center of curvature and a first fat refracting surface located at or near said first image plane and substantially parallel to said first image plane; whereby light from said object plane is reflected successively by said first concave reflecting surface, said first convex reflecting surface, and said second concave reflecting surface and passes through said first convex refracting surface of said first refracting member to form said primary reduced image on said first image plane; and
  a second optical subsystem for reforming said primary reduced image as a secondary reduced image of said object on a second image plane, said second optical subsystem including a second optical axis substantially perpendicular to said first image plane, a third concave reflecting surface, and a second refracting member located between said third concave reflecting surface and said second image plane; said third concave reflecting surface having a center of curvature coincident with said common center of curvature of said first optical subsystem, said second refracting member including a second convex refracting surface having a center of curvature coincident with said center of curvature of said third concave reflecting surface and second flat refracting surface located at or near said second image plane and substantially parallel to s id second image plane; whereby light from said first image plane is reflected by said third concave reflecting surface and passes through said second convex refracting surface to form said secondary reduced image on said second image plane.

8. A system according to claim 7, wherein said first concave reflecting surface and said second concave reflecting surface have an identical radius of curvature.

9. A system according to claim 7, wherein said first and second concave reflecting surfaces constitute parts of a spherical concave mirror.

10. A system according to claim 7, wherein said second optical subsystem has a telecentric arrangement at a side of said second image plane.

11. A system according to claim 7, wherein each of said first and second concave reflecting surfaces has a radius of curvature which is 1.7 times that of said first convex reflecting surface.

12. A reflection type projection optical system, comprising:
  a first optical subsystem for forming on a first image plane a primary image of an object located on an object plane, the first optical subsystem including a first optical axis substantially perpendicular to said object plane, a reflection type image-forming optical system having a magnifying power of one (1) including at least one concave reflecting surface and a first refracting member located between the concave reflecting surface and said first image plane; said concave reflecting surface having a center of curvature at an intersection of said first optical axis and said object plane, said first refracting member including a first convex refracting surface having a center of curvature coincident with that of said concave reflecting surface and a first flat refracting surface located at or near said first image plane and substantially parallel to said first image plane; whereby light from said object plane is reflected by said concave reflecting surface and passes through said first convex refracting surface of said first refracting member to form said primary image on said first image plane; and
  a second optical subsystem for reforming said primary image as a secondary image of the object on a second image plane, the second optical subsystem including a second optical axis substantially perpendicular to said first image plane, a reflecting type image-forming optical system having a magnification of one (1) including at least one concave reflecting surface and a second refracting member located between said concave reflecting surface of said second optical subsystem and said second image plane; said concave reflecting surface of said second optical subsystem having a center of curvature at an intersection of said second optical axis and said first image plane, said second refracting member including a second convex refracting surface having a center of curvature coincident with that of the concave reflecting surface of said second optical subsystem and a second flat refracting surface located at or near said second image plane and substantially parallel to said second image plane; whereby light from said first image plane is reflected by said concave reflecting surface of said second optical subsystem and passes through said second convex refracting surface to form said secondary image on said second image plane.

13. A system according to claim 12, wherein said concave reflecting surface of each of said first and second optical subsystems is a spherical reflecting surface.

14. A system according to claim 12, wherein each of said first and second convex refracting surfaces is a spherical refracting surface.

15. A system according to claim 12, wherein said second optical subsystem has a telecentric arrangement at a side of said second image plane.

* * * * *